United States Patent
Gebhardt et al.

(10) Patent No.: US 10,401,455 B2
(45) Date of Patent: Sep. 3, 2019

(54) METHOD AND MAGNETIC RESONANCE APPARATUS FOR AVOIDANCE OF ARTIFACTS IN THE ACQUISITION OF MAGNETIC RESONANCE MEASUREMENT DATA

(71) Applicant: Siemens Healthcare GmbH, Erlangen (DE)

(72) Inventors: Matthias Gebhardt, Erlangen (DE); Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 76 days.

(21) Appl. No.: 15/699,752

(22) Filed: Sep. 8, 2017

(65) Prior Publication Data

US 2018/0081015 A1    Mar. 22, 2018

(30) Foreign Application Priority Data

Sep. 19, 2016 (DE) .................. 10 2016 217 863

(51) Int. Cl.
*G01R 33/56* (2006.01)
*G01R 33/48* (2006.01)
*G01R 33/561* (2006.01)
*G01R 33/565* (2006.01)

(52) U.S. Cl.
CPC ..... *G01R 33/5608* (2013.01); *G01R 33/4818* (2013.01); *G01R 33/5611* (2013.01); *G01R 33/56563* (2013.01)

(58) Field of Classification Search
CPC ........... G01R 33/5608; G01R 33/4818; G01R 33/5611; G01R 33/56563
See application file for complete search history.

(56) References Cited

U.S. PATENT DOCUMENTS

| | | | |
|---|---|---|---|
| 2002/0097050 A1 | 7/2002 | Kellman et al. | |
| 2002/0153890 A1* | 10/2002 | Madore | G01R 33/5611 324/307 |
| 2009/0072827 A1 | 3/2009 | Hargreaves | |
| 2011/0025325 A1 | 2/2011 | Li et al. | |
| 2011/0148410 A1 | 6/2011 | Zaitsev et al. | |
| 2013/0182932 A1 | 7/2013 | Chen et al. | |

(Continued)

OTHER PUBLICATIONS

Griswold et al., "Generalized Autocalibrating Partially Parallel Acquisitions (GRAPPA)," Magnetic Resonance in Medicine, vol. 47, pp. 1202-1210 (2002).

*Primary Examiner* — Rodney A Bonnette
(74) *Attorney, Agent, or Firm* — Schiff Hardin LLP

(57) ABSTRACT

In a method and magnetic resonance (MR) apparatus for avoidance of artifacts in the acquisition of MR data, first and second undersampled datasets are recorded, the measurement data of each dataset being selected such that artifacts in the first dataset exhibit a phase other than in the second dataset, and the measurement data in the first and second datasets, even when combined, correspond to undersampled dataset. The recorded, undersampled datasets are supplemented with the use of a supplementary kernel of a parallel acquisition method to form supplemented datasets from which a combined, artifact-free dataset is produced. Measurement time is thereby reduced overall compared with customary PAT averaging and compared with recording without the use of a parallel acquisition method.

12 Claims, 5 Drawing Sheets

(56) References Cited

U.S. PATENT DOCUMENTS

2014/0133724 A1* 5/2014 Liu .................... G01R 33/5611
  382/131
2015/0117735 A1* 4/2015 Park ................... G01R 33/5611
  382/131

* cited by examiner

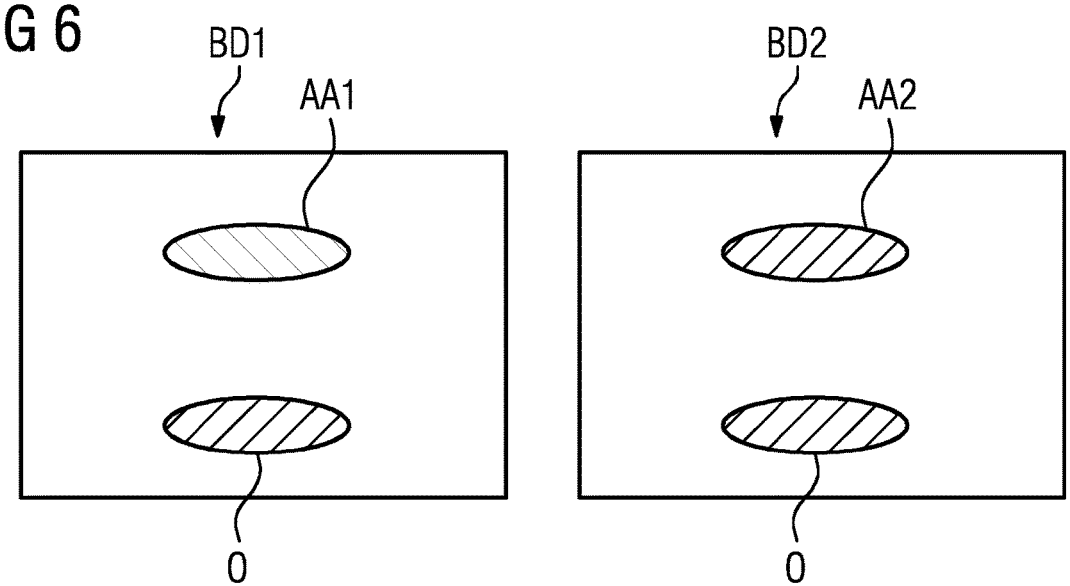

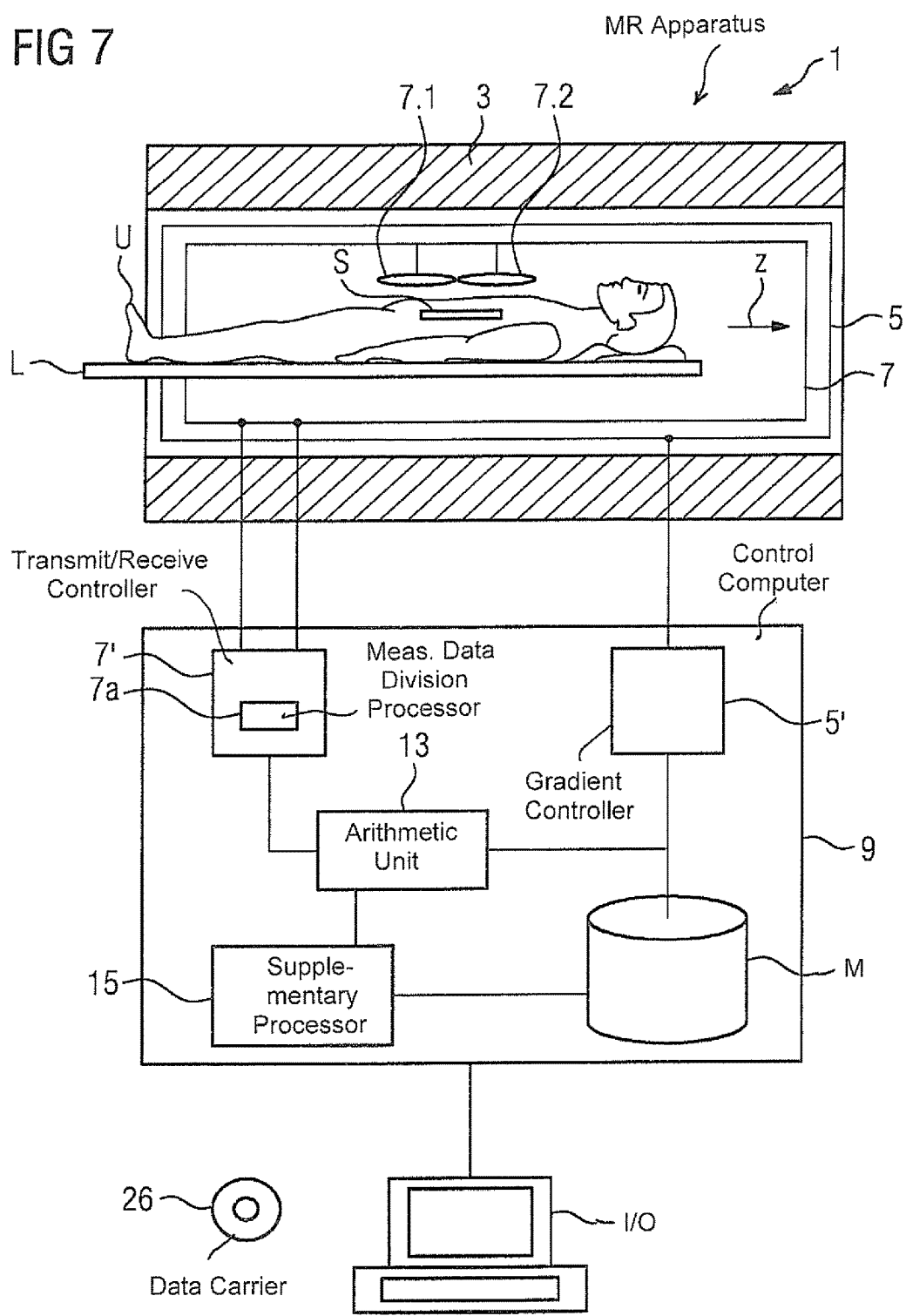

METHOD AND MAGNETIC RESONANCE APPARATUS FOR AVOIDANCE OF ARTIFACTS IN THE ACQUISITION OF MAGNETIC RESONANCE MEASUREMENT DATA

BACKGROUND OF THE INVENTION

Field of the Invention

The present invention concerns the avoidance of artifacts in the context of acquisition of measurement data using magnetic resonance technology.

Description of the Prior Art

Magnetic resonance (MR) is a known modality with which images from the inside of an object under investigation can be produced. Simply described, for this purpose the object under investigation is positioned in a magnetic resonance scanner in a strong, static, homogenous basic magnetic field, also referred to as $B_0$ field, with a field strength of 0.2 Tesla to 7 Tesla and more, such that nuclear spins in the object are orientated along the basic magnetic field. To trigger magnetic resonance, radio-frequency excitation pulses (RF pulses) are radiated into the object under investigation. The triggered magnetic resonance signals are digitized and archived as complex numerical values in a k-space matrix as so-called k-space data. For spatial encoding the measurement data, rapidly switched magnetic gradient fields are superimposed on the basic magnetic field. From k-space matrix provided with values, an MR image can be reconstructed by a multidimensional Fourier transformation, or spectroscopy data can be determined.

Parallel acquisition techniques such as GRAPPA ("GeneRalized Autocalibrating Partially Parallel Acquisition") and SENSE ("Sensitivity Encoding") are known, in which, with the use of several RF coils, only an undersampled number of measurement data items according to the Nyquist Theorem are recorded in k-space. Such parallel acquisition techniques are used, for example, to reduce the overall measurement time necessary for the recording of the measurement data, or to increase the resolution. In doing so, the "missing" measurement data are supplemented on the basis of sensitivity data of the RF coils used and calibration data from the measured measurement data.

However, such parallel acquisition techniques are prone to aliasing artifacts (also referred to as "wrap-around" or "foldover artifacts") which may occur when locally-defined areas in the measured object under investigation exhibit a significantly stronger signal intensity than surrounding areas, such as a signal intensity approx. 100% higher than the average of the signal intensities of the surrounding areas or more. Such a significantly stronger signal intensity may be produced by the object under investigation itself, such as in measurements in the head area where, due to their high water content, the eyes usually produce a significantly stronger signal than the surrounding tissue. However, it is also possible for such an increased signal intensity to be produced as a result of restrictions in the hardware of the magnetic resonance scanner. Magnetic resonance scanners with a short patient tunnel (for example, approx. 1 m or less), often have a reduced homogeneity of the magnetic and gradient fields in this direction, (usually the z-direction) of the magnetic resonance scanner. This is because, due to the relatively limited extent in a longitudinal direction, the peripheral areas of the FOV (measurement area, "field of view") may be compressed in the direction of the ends of the patient tunnel. This can lead to increased signal intensity in the corresponding peripheral areas when reconstructing the measurement data as image data. Particularly, for sagittal or coronary images of patients, which are in planes that contain the longitudinal direction of the patient tunnel, interfering aliasing artifacts may occur.

In order to avoid such aliasing artifacts, it is of course possible to simply not use parallel acquisition techniques, but this means also foregoing their advantages, in particular the reduction of the measurement time.

If a parallel acquisition technique is to be employed, the aliasing artifacts can be corrected, for example, by using a PAT averaging (Parallel Acquisition Technique—averaging) method in which two or more datasets, each undersampled in k-space are recorded. In each dataset, for example, only half of the amount of k-space that is actually to be undersampled according to the Nyquist theorem can be filled (acceleration factor A=2). For example, in a first undersampled dataset, data can be entered into only every other k-space line (for instance, all odd-numbered k-space lines), and in a second undersampled dataset, the respective k-space lines not filled by the first undersampled dataset (likewise only every other k-space line, such as all even-numbered k-space lines), can be filled. Such an acquisition scheme is shown diagrammatically in FIG. 2, in which k-space lines in which measurement data were recorded are shown in a first dataset DS1 and in a second dataset DS2 with solid lines, and "missing", unrecorded k-space lines for which no measurement data were recorded, are shown with dotted lines. Each of the centrally located k-space lines of the two datasets DS1 and DS2 recorded in k-space can be combined to form a calibration dataset for a reconstruction of the measurement data that are missing in one of the datasets DS1 and DS2, with the use of a parallel acquisition technique. In this manner, two individually supplemented datasets are obtained, which can be averaged.

If each of k-space lines recorded in the datasets are recorded such data that give rise to aliasing artifacts are displaced in relation to one another from line to line, the (aliasing) artifacts contained in the datasets exhibit different phases in each of the datasets, so the two supplemented datasets can be processed with the aliasing artifacts contained in the supplemented datasets cancelling each other, due to their opposite phases. For example, in an averaging of the supplemented first dataset and the supplemented second dataset, or an averaging of first and second image data obtained respectively from the supplemented first dataset and the supplemented second dataset, or an addition of the aforementioned datasets, artifacts can thereby be removed or at least reduced.

A disadvantage of PAT averaging for the correction of aliasing artifacts is that a time saving achieved by the parallel acquisition method is essentially used up again by the necessary recording of two datasets (even if both are undersampled) such that overall no further acceleration of the measurement is achieved. In contrast to a measurement with measurement data completely sampled according to the Nyquist theorem and without the use of a parallel acquisition technique, however, PAT averaging methods are less sensitive to movements of the object under investigation, as a result of the averagings that are performed.

SUMMARY OF THE INVENTION

An object of the invention is to enable avoidance of aliasing artifacts even when using parallel acquisition techniques, with simultaneous acceleration of the overall measurement.

The invention is based on the insight that advantage can be take of the benefits of a PAT averaging method when the recorded undersampled datasets, even when combined, do not produce any complete dataset according to the Nyquist theorem.

A method according to the invention for the avoidance of artifacts in the acquisition of MR data of an object under investigation has the following steps.

A first dataset of measurement data of a target area of the object under investigation is recorded, wherein the first dataset is undersampled according to the Nyquist theorem with a first acceleration factor.

A second dataset of measurement data of the target area of the object under investigation is acquired, wherein the second dataset is undersampled according to the Nyquist theorem, with a second acceleration factor.

The measurement data of the first dataset and the measurement data of the second dataset are selected such that artifacts in the first dataset exhibit a phase other than in the second dataset. The measurement data recorded in the first dataset and in the second dataset, even when combined, correspond to an undersampled dataset according to the Nyquist theorem.

The first dataset is supplemented using a supplementary kernel of a parallel acquisition method, so as to form a first supplemented dataset.

The second dataset is supplemented using the supplementary kernel of the parallel acquisition method, so as to form a second supplemented dataset.

A combined dataset is formed based on the first supplemented dataset and the second supplemented dataset.

By combining the first supplemented dataset according to the invention and the second supplemented dataset according to the invention so as to form a combined dataset, artifacts, in particular aliasing artifacts, can be eliminated in the combined dataset. Through the recording according to the invention of the measurement data recorded in the first dataset and in the second dataset such that, even combined, a dataset undersampled according to the Nyquist theorem exists, the measurement time is reduced overall, both compared with a customary PAT averaging method and compared with a recording without the use of a parallel acquisition method.

The method therefore reduces or eliminates artifacts that would otherwise occur in local fluctuations (also caused, for example, by short patient tunnels) of the signal intensities in a target area to be measured, and simultaneously reduces the required measurement time.

A magnetic resonance apparatus according to the invention has a data acquisition scanner that has a basic field magnet, a gradient coil arrangement, and a radio-frequency (RF) antenna system, and a control computer programmed to perform the method according to the invention, with a radio-frequency transmit/receive controller and a measurement data division as well as a measurement data supplementary processor.

The present invention also encompasses a non-transitory, computer-readable data storage medium encoded with programming instructions that, when the storage medium is loaded into a control computer or a computer system of a magnetic resonance apparatus, cause the control computer or computer system to operate the magnetic resonance apparatus in order to implement any or all of the embodiments of the method in accordance with the invention, as described above.

The advantages and embodiments specified with regard to the method also apply to the magnetic resonance apparatus, and the electronically readable data storage medium.

BRIEF DESCRIPTION OF THE DRAWINGS

FIG. 6 schematically illustrates first and second image data created according to the invention.

FIG. 7 a schematic illustration of a magnetic resonance system according to the invention.

DESCRIPTION OF THE PREFERRED EMBODIMENTS

Figure 1:
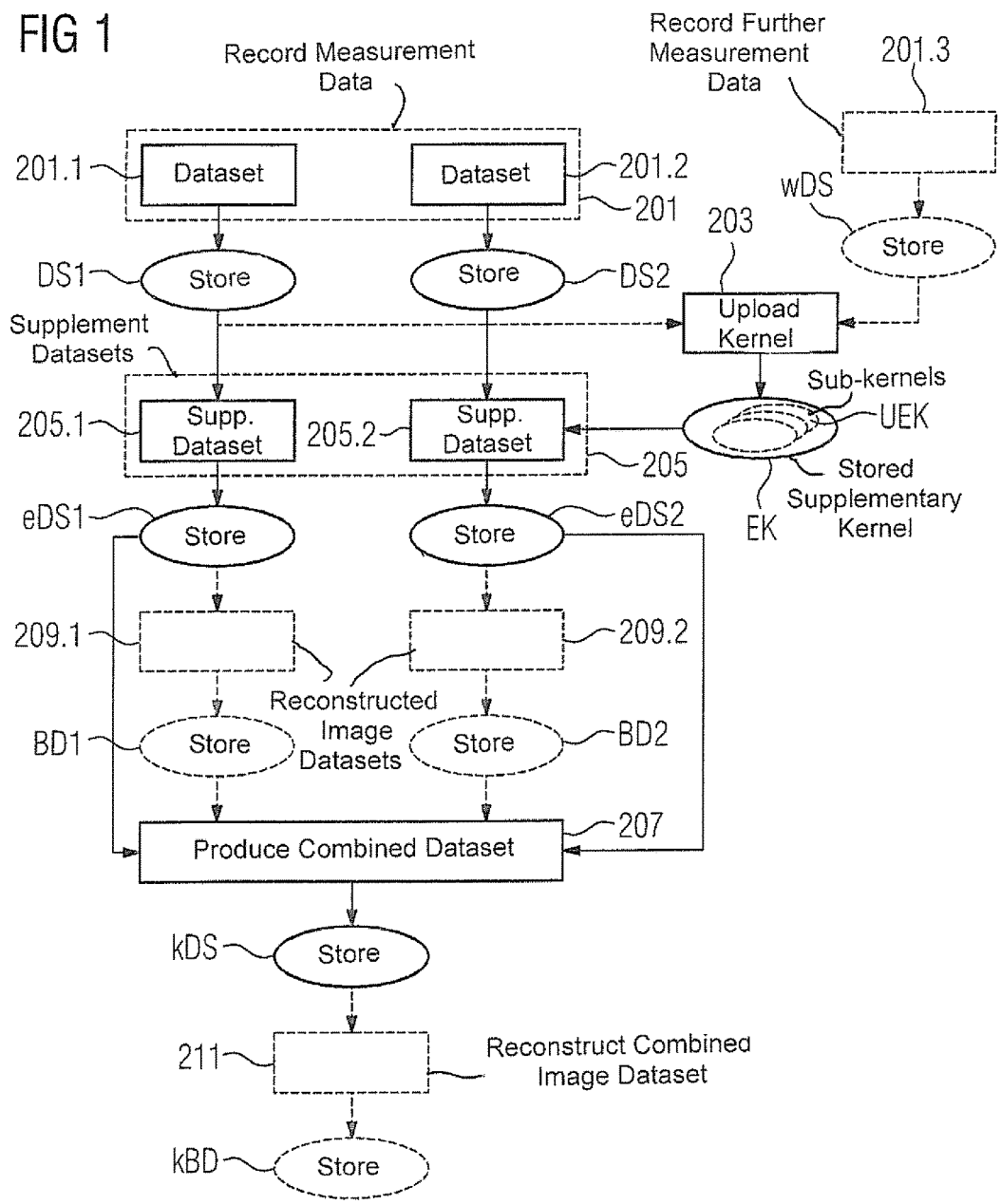
FIG. 1 is a diagrammatic flowchart of the method according to the invention.
Figure 2:
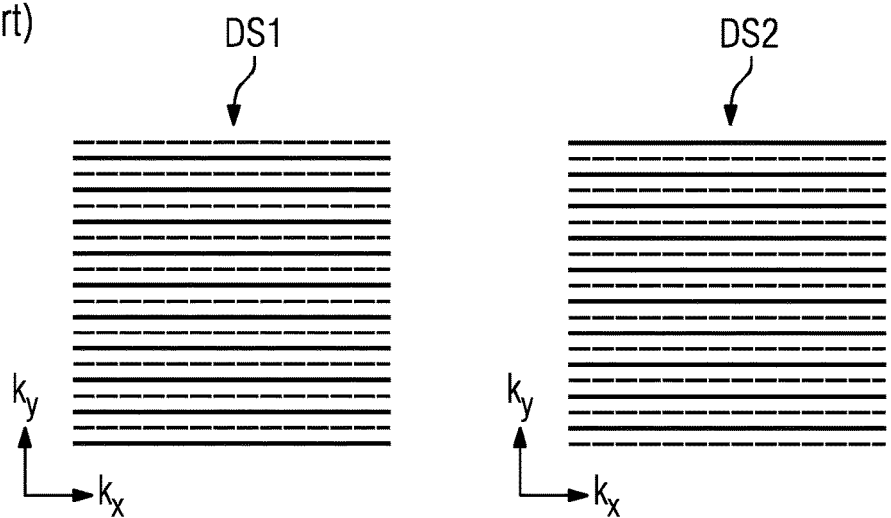
FIG. 2 schematically illustrates an exemplary distribution of measured and unmeasured measurement data in a PAT averaging method.

FIG. 1 is a flowchart of the method according to the invention for the avoidance of artifacts in the acquisition of MR data of an object under investigation.

First, measurement data are recorded (Block 201.1) and stored in a first dataset DS1, and further measurement data are recorded (Block 201.2) and stored in a second dataset DS2.

In doing so, it is possible for the measurement data of the first and of the second datasets DS1 and DS2 to be recorded in a common measurement 201 and according to the position of each data entry in k-space, that data entry is assigned to the first or the second dataset DS1 or DS2. It is also possible for the measurement data of the first and the second datasets DS1 and DS2 to be recorded respectively in separate measurements. The recording of the measurement data of the first and the second datasets DS1 and DS2 can be performed with the use of a spin-echo sequence, which especially benefits from the advantages of the method according to the invention.

In any case, the measurement data are recorded such that artifacts, in particular aliasing artifacts, in the measurement data of the first dataset DS1 exhibit a phase other than corresponding artifacts in the measurement data of the second dataset DS2. This can be achieved, for example, by the first dataset DS1 and the second dataset DS2 being disjoint with regard to the measurement data contained therein, i.e. the second dataset DS2 does not contain any measurement data at k-space positions that correspond to k-space positions of the data in the first dataset DS1, and vice versa.

Furthermore, the measurement data are recorded such that the first dataset DS1 are Nyquist undersampled according to a first acceleration factor F1, and the second dataset DS2 are Nyquist undersampled according to a second acceleration factor F2. In doing so, the first and second acceleration factors F1 and F2 are selected such that the measurement data recorded in the first dataset and in the second dataset, even when combined, produce an undersampled dataset according to the Nyquist theorem. In doing so, the second acceleration factor F2 may be selected to be larger than the first acceleration factor F1. An acceleration factor corresponds to a degree of undersampling. As a result of the recorded measurement data in the first and second datasets DS1 and DS2, even when combined, not producing a complete dataset according to the Nyquist theorem, the recording of the measurement data of the first and of the second datasets DS1 and DS2 can take place in a shorter period of time than would be required for the recording of a complete dataset.

For example, the first dataset DS1 can be recorded with an acceleration factor of F1=2, i.e. half of the measurement data required for a complete sampling according to the Nyquist theorem are actually recorded. For example, for the line-by-line recording of k-space, only every other k-space line is recorded. In this manner, the first dataset DS1 still contains a relatively large amount of actually measured measurement data, so errors are avoided in the reconstruction of missing measurement data.

When the first dataset DS1 is recorded with an acceleration factor F1=2, the second dataset DS2 can be recorded with a significantly higher acceleration factor F2 compared to the first acceleration factor F1, for example, with a second acceleration factor F2 that is two to four times as high. In principle, it is sufficient for the second dataset DS2 to contain measurement data for at least one k-space point with artifacts exhibiting a phase other than corresponding artifacts in the measurement data of the first dataset DS1.

By recording the second dataset DS2 with a higher acceleration factor than when recording the first dataset DS1, the overall measurement time can be more significantly reduced, both compared with a customary PAT averaging method and compared with a recording without the use of a parallel acquisition method.

Figure 3:
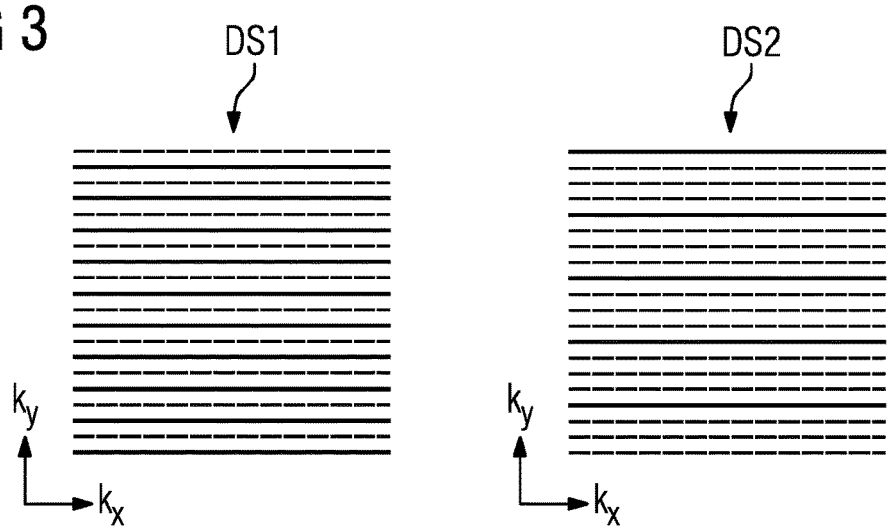
FIG. 3 schematically illustrates an exemplary distribution of measured and unmeasured measurement data in the method according to the invention.

FIG. 3 shows a simplified view of an exemplary distribution of measured and unmeasured measurement data in k-space of first and second datasets DS1 and DS2 according to the invention. In the shown example, for clarity, only a small number of k-space lines is shown. The first dataset DS1 (shown on the left) is here recorded with a first acceleration factor F1 equal to two (F1=2) such that every other k-space line, for example, all the odd-numbered k-space lines (solid lines), is recorded (filled with data entries, also called sampling), but the other k-space lines, for example, all the even-numbered k-space lines (dotted lines) are not filled. In the second dataset DS2 (shown on the right), only every fourth k-space line is recorded (solid lines), and not the remaining k-space lines (dotted line). The second acceleration factor F2 here is therefore equal to four (F2=4).

For the method according to the invention, a supplementary kernel EK of a parallel acquisition method to be used is uploaded (Block 203). The supplementary kernel EK can be created on the basis of recorded measurement data of the first dataset DS1 and/or on the basis of recorded measurement data of the second dataset DS2 and/or on the basis of measurement data recorded with the use of a further measurement (Block 201.3) of a further dataset wDS. Generally, a supplementary kernel EK is created on the basis of reference measurement data, usually from the central regions of each k-space. The creation of a supplementary kernel for parallel acquisition methods from existing reference measurement data is known in principle.

Such reference measurement data can be recorded only by a further measurement 201.3. However, it is also possible for measurement data of a further dataset wDS, recorded with the use of a further measurement 201.3, to be used, together with measurement data of the first dataset DS1 and/or of the second dataset DS2, as reference measurement data for the creation of the supplementary kernel EK.

Figure 4:
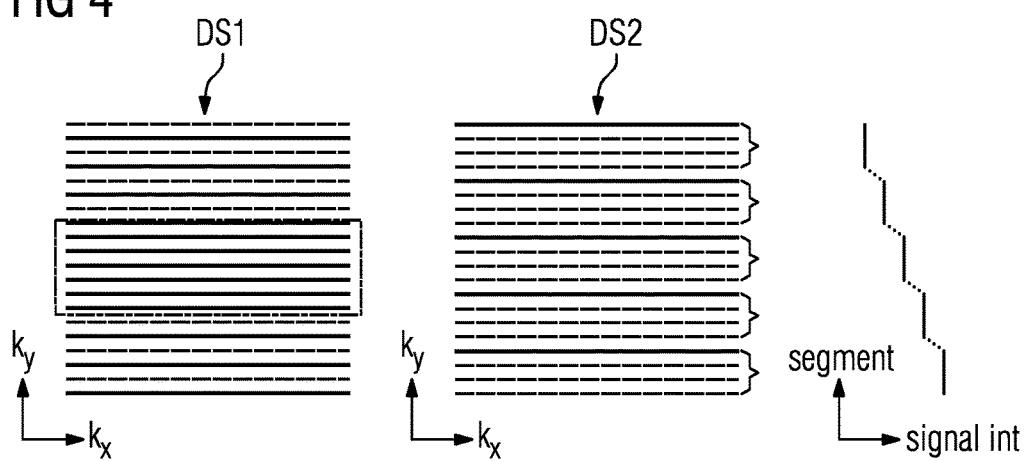
FIG. 4 schematically illustrates a further exemplary distribution of measured and unmeasured measurement data in the method according to the invention.

An example of this latter option is shown in FIG. 4 in which essentially the exemplary distribution of measured and unmeasured measurement data from FIG. 3 is repeated. In FIG. 4, however, in the first dataset DS1, in a central area surrounded by a dot-and-dash line box, missing measurement data are supplemented by measurement data of a further dataset wDS, and the measurement data of the first and the further dataset DS1 and wDS in the surrounded area are used as reference measurement data for the creation of the supplementary kernel EK.

The measurement data of the first and second datasets DS1 and DS2 can be recorded in segments, for example, by execution of a turbo spin echo sequence (TSE sequence), also referred to as a fast spin echo sequence (FSE sequence). This means that for each repetition of the sequence, measurement data of different segments in k-space are recorded consecutively. In the simplified example shown, k-space lines are divided into five segments. Furthermore, as shown on the right in FIG. 4, the intensity of the signal received ("signal int") decreases over time, and thus also in the consecutively recorded segments ("segment"). To avoid intensity fluctuations in the measurement data of the first and the second datasets DS1 and DS2, the measurement data of the first and of second datasets DS1 and DS2, as shown in FIG. 4, can be respectively recorded in uniform segments in k-space. This means that, both for the first dataset DS1 and for the second dataset DS2, k-space is divided into uniform segments in which the measurement data are recorded. For the second dataset DS2 shown in FIG. 4, due to the higher second acceleration factor F2 compared with the first acceleration factor F1 of the first dataset DS1, fewer repetitions are necessary to record the second dataset DS2 in the desired undersampled manner, thus saving measurement time.

Furthermore, it is also possible for the first and the second datasets DS1 and DS2 to be sampled such that, in a selected area of k-space of the first dataset DS1, measurement data missing in the second dataset DS2 due to undersampling are recorded. The measurement data thus recorded in the selected area can, if necessary, be further supplemented by measurement data of a further dataset wDS to obtain sufficient reference measurement data in the selected area.

Figure 5:
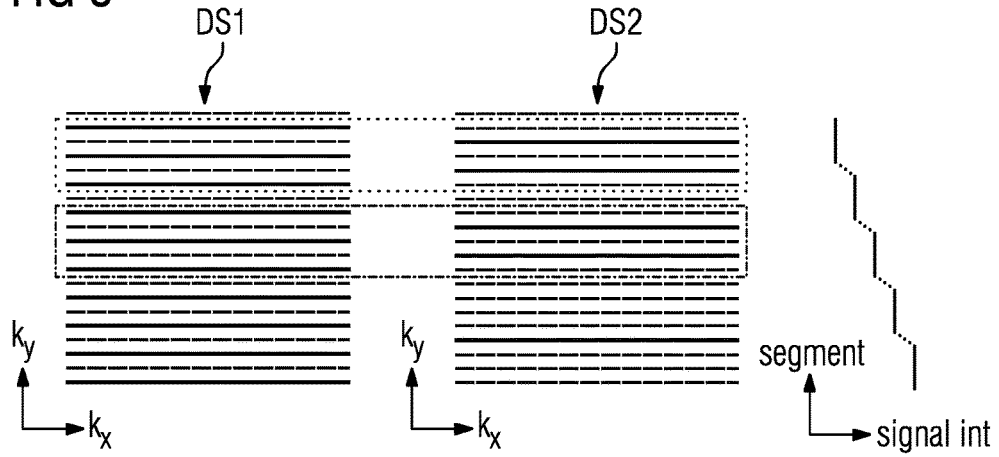
FIG. 5 schematically illustrates a further exemplary distribution of measured and unmeasured measurement data in the method according to the invention.

Such an example is shown in FIG. 5, in which the exemplary distribution of measured and unmeasured measurement data from FIG. 3 is varied in selected areas. A first selected area is shown in FIG. 5 by a border with a dot-and-dash line, a further selected area by a border with a dotted line. The measurement data to be recorded for the second dataset DS2, here k-space lines to be recorded, were rearranged such that in the selected areas together with the measurement data recorded for the first dataset DS1, there is a complete set of measurement data (according to the Nyquist theorem). The rearrangement was done such that the same number of measurement data items, here k-space lines, is recorded for the second dataset DS2 as in the example of FIG. 3 (or 4) (solid lines) but these are no longer uniformly distributed in k-space, so only a supplement of the measurement data of the first dataset DS1 is achieved in the selected areas.

With the use of the supplementary kernel EK, the recorded measurement data are supplemented (Block 205). The first dataset DS1 is supplemented with the use of the supplementary kernel EK of the parallel acquisition method used to form a first supplemented dataset eDS1 (Block 205.1), and the second dataset DS2 is supplemented with the use of the supplementary kernel EK of the parallel acquisition method used to form a second supplemented dataset eDS2 (Block 205.2). The supplementary kernel EK may be composed of several supplementary sub-kernels UEK, which take account of the measurement data contained and not contained in the first and second datasets DS1 and DS2, respectively. When, for example, the first dataset DS1 was recorded according to a first degree of undersampling and the second dataset DS2 according to a second degree of undersampling, wherein the first and the second degrees of undersampling are different, and/or when the measurement data measured in the first dataset DS1 are arranged spatially differently in k-space from the measurement data in the second dataset DS2, then, for the supplementation of the first dataset DS1 to form the first supplemented dataset eDS 1, a different supplementary sub-kernel UEK is used that is different from the supplementary sub-kernel used for the supplementation of the second dataset DS2 to form the second supplemented dataset eDS2. To supplement a dataset DS1 or DS2, several supplementary sub-kernels UEK can be used. This may be the case when the measurement data measured in the dataset DS1 or DS2 are unevenly distributed.

Based on the first supplemented dataset eDS1 and the second supplemented dataset eDS2, a combined dataset kDS is produced (Block 207).

The combined dataset kDS can be a k-space dataset that is produced by combining the first supplemented dataset eDS1 and the second supplemented dataset eDS2. In a further step 211, such a combined dataset kDS is reconstructed to form an image dataset kBD.

However, it is also possible for the combined dataset kDS to already be an image dataset, which is produced by combining first image data BD1 reconstructed from the first supplemented dataset eDS1 in a step 209.1, and second image data BD2 reconstructed from the second supplemented dataset eDS2 in a step 209.2.

FIG. 6 schematically shows first image data BD1 and second image data BD2 produced according to the invention. The phase of the object O, and the artifacts AA1, AA2, are rendered by hatching. As can be seen, an object O with a strong signal has produced an (aliasing) artifact AA1 and AA2 in the first and second image data BD1 and BD2, respectively. Through the method according to the invention, however, the artifacts AA1 and AA2 have an opposing phase (represented by the opposing hatching). As a result, by combining the first and second image data BD1 and BD2, the artifacts AA1 and AA2 compensate each other and may, for example, cancel each other.

FIG. 7 schematically illustrates a magnetic resonance apparatus 1 according to the invention. This apparatus 1 has a data acquisition scanner with a basic field magnet 3 that produces a basic magnet field, a gradient coil arrangement 5 that produces gradient fields, a radio-frequency antenna 7 for emitting and for receiving radio-frequency signals and a control computer 9 configured to operate the apparatus 1 and the scanner in order to perform the method according to the invention. In FIG. 7 these subunits of the magnetic resonance apparatus 1 are shown only diagrammatically. The radio-frequency antenna 7 may be composed of several subunits, for example, several coils like the shown coils 7.1 and 7.2, or more coils that may be designed either for only transmitting radio-frequency signals or for only receiving the triggered radio-frequency signals or for both.

To examine an object U under investigation, for example, a patient or a phantom, this object U is introduced into the measuring volume of the scanner on a bed L. The slice S represents an exemplary target volume of the object U under investigation, from which measurement data are to be recorded.

The control computer 9 is programmed to control the magnetic resonance system 1 and in particular to control the gradient coil arrangement 5 via a gradient controller 5' and to control the radio-frequency antenna 7 via a radio-frequency transmit/receive controller 7'. The radio-frequency antenna 7 may have several channels via which signals can be transmitted or received.

The radio-frequency antenna 7, together with its radio-frequency transmit/receive controller 7', is responsible for the production and the emission (transmission) of a radio-frequency alternating field for the manipulation of the nuclear spins in order to give those spins a specified magnetization, for example, in slices S of the object U under investigation. In doing so, the nominal frequency of the radio-frequency alternating field, also referred to as a B1 field, must be close to the resonance frequency of the spins to be manipulated. To produce the B1 field, controlled currents are supplied to the radio-frequency antenna 7 from the radio-frequency transmit/receive controller 7'. A measurement data division processor 7a according to the invention (which, for example, may be a part of the radio-frequency transmit/receive controller 7') determines which measurement data are being recorded, and assigns the recorded data to the appropriate dataset according to the invention.

Furthermore, the control computer 9 has a measurement data supplementary processor 15 with which supplementary kernels are produced and "missing" measurement data supplemented in the recorded datasets, with the use of produced supplementary kernels. The control computer 9 is designed overall to perform the method according to the invention for the avoidance of artifacts in the acquisition of MR data of an object under investigation.

An arithmetic unit 13 that includes the control computer 9 is designed to perform all the necessary arithmetic operations for the necessary measurements and provisions. Intermediate findings and findings required for this or determined in the process can be stored in a memory M of the control computer 9. The units shown here are not necessarily to be understood as physically separate units, but simply represent a breakdown into logical units, which can also be realized, for example, in fewer units or in only a single physical unit.

Via an input/output device I/O of the magnetic resonance apparatus 1, control commands can be entered by a user into the magnetic resonance apparatus 1 and/or findings of the control computer 9 such as image data can be displayed.

A method described herein may exist in the form of computer code of an electronically readable data carrier 26. The code causes the control computer 9 to perform the described method when the data carrier 26 is loaded into the control computer 9 and the computer 9 executes the instructions embodied in the code.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:
1. A method for operating a magnetic resonance (MR) apparatus in order to avoid artifacts in acquired MR data, said method comprising:
operating an MR apparatus, while a subject is situated therein, in order to record a first dataset of measurement data of a target area of the subject, said first dataset being Nyquist undersampled according to a first acceleration factor;

operating the MR apparatus to record a second dataset of measurement data of the target area of the subject, said second dataset being Nyquist undersampled according to a second acceleration factor;

operating said MR apparatus to acquire the respective measurement data in the first and second datasets such that artifacts in said first dataset have a phase that is other than a phase of said artifacts in the second dataset and so that the measurement data in the first dataset and in the second dataset, even when combined, result in a Nyquist undersampled combined dataset;

providing said first and second datasets to a computer and, in said computer, supplementing said first dataset using a supplementary kernel of a parallel acquisition method, in order to form a first supplemented dataset;

in said computer, supplementing said second dataset using the supplemental kernel of the parallel acquisition method in order to form a second supplemented dataset; and in said computer, generating a combined dataset from said first supplemented dataset and said second supplemented dataset, and making the combined dataset available from the computer in electronic form as a datafile.

2. A method as claimed in claim 1 comprising operating said MR apparatus with said second acceleration factor being higher than said first acceleration factor.

3. A method as claimed in claim 1 comprising:
recording said first dataset as a first k-space dataset and supplementing said first k-space dataset with said kernel in order to form said first supplemented dataset as a first supplemented k-space dataset;
recording said second dataset as a second k-space dataset and supplementing said second k-space dataset with said kernel in order to form said second supplemented dataset as a second supplemented k-space dataset; and
generating said combined dataset by combining said first and second k-space datasets.

4. A method as claimed in claim 1 comprising:
recording said first dataset as a first k-space dataset and supplementing said first k-space dataset with said kernel in order to form said first supplemented dataset as a first supplemented k-space dataset;
recording said second dataset as a second k-space dataset and supplementing said second k-space dataset with said kernel in order to from said second supplemented dataset as a second supplemented k-space dataset;
in said computer, reconstructing first image data from said first supplemented k-space dataset and reconstructing second image from said second supplemented k-space dataset; and
generating said combined dataset as a combined image dataset by combining said first image data and said second image data.

5. A method as claimed in claim 1 comprising operating said MR apparatus to execute a common measurement sequence in which both of said first and second datasets are recorded.

6. A method as claimed in claim 1 comprising, in said computer, generating said kernel from at least one of measurement data in said first dataset, measurement data in said second dataset, and measurement data in a further dataset provided to said computer, other than said first dataset and said second dataset.

7. A method as claimed in claim 1 comprising entering said first dataset into a memory as a first k-space dataset and entering said second dataset into a memory as a second k-space dataset, said second k-space dataset having data points therein that are unfilled due to said Nyquist undersampling, and recording data in a selected area of said first k-space dataset for use in filling said unfilled data points in said second k-space dataset.

8. A method as claimed in claim 1 comprising entering each of said first and second datasets into k-space in segments that are uniform segments of k-space for each of said first and second datasets.

9. A method as claimed in claim 1 comprising recording said first dataset with said first acceleration factor being two, and recording said second dataset with said second acceleration factor being in a range between twice to four times as high as said first acceleration factor.

10. A method as claimed in claim 1 comprising operating said MR apparatus to execute a spin-echo sequence in which said first and second datasets are recorded.

11. A magnetic resonance (MR) apparatus comprising:
an MR data acquisition scanner;
a computer configured to operate said MR data acquisition scanner, while a subject is situated therein, in order to record a first dataset of measurement data of a target area of the subject, said first dataset being Nyquist undersampled according to a first acceleration factor;
said computer being configured to operate said MR data acquisition scanner to record a second dataset of measurement data of the target area of the subject, said second dataset being Nyquist undersampled according to a second acceleration factor;
said computer being configured to operate said MR data acquisition scanner to acquire the respective measurement data in the first and second datasets such that artifacts in said first dataset have a phase that is other than a phase of said artifacts in the second dataset and so that the measurement data in the first dataset and in the second dataset, even when combined, result in a Nyquist undersampled combined dataset;
said computer being configured to supplement said first dataset using a supplementary kernel of a parallel acquisition method, in order to form a first supplemented dataset;
said computer being configured to supplement said second dataset using the supplemental kernel of the parallel acquisition method in order to form a second supplemented dataset; and
said computer being configured to generate a combined dataset from said first supplemented dataset and said second supplemented dataset, and to make the combined dataset available from the computer in electronic form as a datafile.

12. A non-transitory, computer-readable data storage medium encoded with programming instructions, said storage medium being loaded into a computer system of a magnetic resonance (MR) apparatus, and said programming instructions causing said computer system to:
operate said MR apparatus, while a subject is situated therein, in order to record a first dataset of measurement data of a target area of the subject, said first dataset being Nyquist undersampled according to a first acceleration factor;
operate the MR apparatus to record a second dataset of measurement data of the target area of the subject, said second dataset being Nyquist undersampled according to a second acceleration factor;

operate said MR apparatus to acquire the respective measurement data in the first and second datasets such that artifacts in said first dataset have a phase that is other than a phase of said artifacts in the second dataset and so that the measurement data in the first dataset and in the second dataset, even when combined, result in a Nyquist undersampled combined dataset;

supplement said first dataset using a supplementary kernel of a parallel acquisition method, in order to form a first supplemented dataset;

supplement said second dataset using the supplemental kernel of the parallel acquisition method in order to form a second supplemented dataset; and generate a combined dataset from said first supplemented dataset and said second supplemented dataset, and make the combined dataset available from the computer system in electronic form as a datafile.

\* \* \* \* \*